United States Patent [19]

Anderson

[11] Patent Number: 5,760,526
[45] Date of Patent: Jun. 2, 1998

[54] PLASTIC ENCAPSULATED SAW DEVICE

[75] Inventor: Michael John Anderson, Phoenix, Ariz.

[73] Assignee: Motorola, Inc., Schaumburg, Ill.

[21] Appl. No.: 416,126

[22] Filed: Apr. 3, 1995

[51] Int. Cl.⁶ .................................................. H01L 41/08
[52] U.S. Cl. .................................. 310/313 R; 310/340
[58] Field of Search ........................ 310/313 R, 340, 310/344; 333/193–196, 150–155

[56] References Cited

U.S. PATENT DOCUMENTS

| | | | |
|---|---|---|---|
| 4,028,646 | 6/1977 | Ikushima et al. | 333/72 |
| 4,037,176 | 7/1977 | Ono et al. | 333/30 R |
| 4,047,129 | 9/1977 | Ishiyama | 333/72 |
| 4,096,455 | 6/1978 | Drummond | 333/30 R |
| 4,188,596 | 2/1980 | Miura | 333/151 |
| 4,191,905 | 3/1980 | Yasuda et al. | 310/344 |
| 4,266,156 | 5/1981 | Kizaki | 310/344 |
| 4,270,105 | 5/1981 | Parker et al. | 333/155 |
| 4,405,875 | 9/1983 | Nagai | 310/344 |
| 4,512,198 | 4/1985 | Sinha et al. | 73/703 |
| 4,586,382 | 5/1986 | Sinha | 73/703 |
| 4,699,682 | 10/1987 | Takishima | 310/313 R X |
| 4,993,000 | 2/1991 | Niitsuma | 310/313 R X |
| 5,010,270 | 4/1991 | Greer | 310/313 D |
| 5,051,645 | 9/1991 | Brace et al. | 310/313 D |
| 5,091,051 | 2/1992 | Greer | 156/643 |
| 5,095,240 | 3/1992 | Nysen et al. | 310/313 R |
| 5,208,504 | 5/1993 | Parker et al. | 310/313 R |
| 5,215,546 | 6/1993 | Cho et al. | 29/25.01 |
| 5,281,883 | 1/1994 | Ikata et al. | 310/313 R |
| 5,337,026 | 8/1994 | Borchelt et al. | 333/150 |
| 5,471,722 | 12/1995 | Yatsuda | 310/344 X |
| 5,504,980 | 4/1996 | Yoshingaga et al. | 310/340 X |

*Primary Examiner*—Mark O. Budd
*Attorney, Agent, or Firm*—Brian M. Mancini; Gary J. Cunningham

[57] ABSTRACT

A plastic molded SAW device (50) is provided by flip-chipping a SAW die (28) onto a die flag (16) of a lead frame (10) and attaching the two (28, 10) together by an annular ring (26, 60, 62) of an insulating material or other solder, so that an active central portion (52) of the SAW die (28) faces the die flag (16) but is separated therefrom. Electrical contacts to the circuitry on the SAW die (28) are made, most conveniently by solder bumps (36) which seal to electrode fingers (18) on the lead frame (10). This provides a very small sealed void (40, 74, 82) immediately above the active portion (52) of the SAW die (28) so that the attached die (28) and lead frame (10) combination can be over molded with plastic encapsulant (38) without such plastic encapsulant (38) coming in contact with the active region (52) of the SAW die surface (42).

6 Claims, 2 Drawing Sheets

PLASTIC ENCAPSULATED SAW DEVICE

FIELD OF THE INVENTION

The present invention concerns the encapsulation of surface acoustic wave (SAW) devices, and more particularly, an improved means and method for plastic encapsulation of such devices.

BACKGROUND OF THE INVENTION

Surface acoustic wave (SAW) devices are frequently used in commercial and other applications as RF and IF filters to provide frequency selectivity and other electronic functions. A SAW device depends upon acoustic wave generation. In some cases these acoustic waves are localized to the surface of the substrate. The substrates are piezoelectric materials. Because the acoustic waves in a SAW device often propagate along or very near the surface, SAW devices are generally very sensitive to surface conditions. This sensitivity is not of a chemical or electronic charge nature as it is, for example, in the case of semiconductors, but is of a mechanical nature. For example, foreign material in contact with the surface of a SAW device can change the elastic and inertial properties of the surface thereby altering the attenuation and propagation of acoustic waves moving along on the surface.

Because of this surface sensitivity, present day SAW devices are typically packaged in hermetic enclosures. Low cost packaging techniques which are, for example, widely used in connection with semiconductor devices and integrated circuits are not generally used in connection with SAW devices. For example, simple transfer molding of plastic enclosures has not been practicable. In transfer molding, a plastic material in a heated and molten state is forced through channels in a mold to surround the active device die, under pressure, to create a plastic enclosure. This process can destroy SAW device performance if it directly coats the surface of the SAW with mold compound.

Because of this, nearly all current SAW devices depend upon the use of hermetic packaging techniques for environmental protection. Ceramic or metal enclosures with solder or welded seal construction are common. Hermetic packaging is generally costly in terms of both the piece parts required and in the encapsulation processing. As the technology for fabricating SAW die themselves has improved, the packaging costs have become a larger and larger share of the total manufacturing costs. Accordingly, there continues to be a need for improved means and methods for encapsulating SAW devices, especially those which permit one to employ low cost plastic encapsulation techniques.

It is an advantage of the present invention, that SAW devices can be encapsulated in plastic using conventional injection or transfer molding techniques in a manner that preserves the desirable electrical characteristics of the encapsulated SAW device.

DETAILED DESCRIPTION OF THE DRAWINGS

Figure 1:
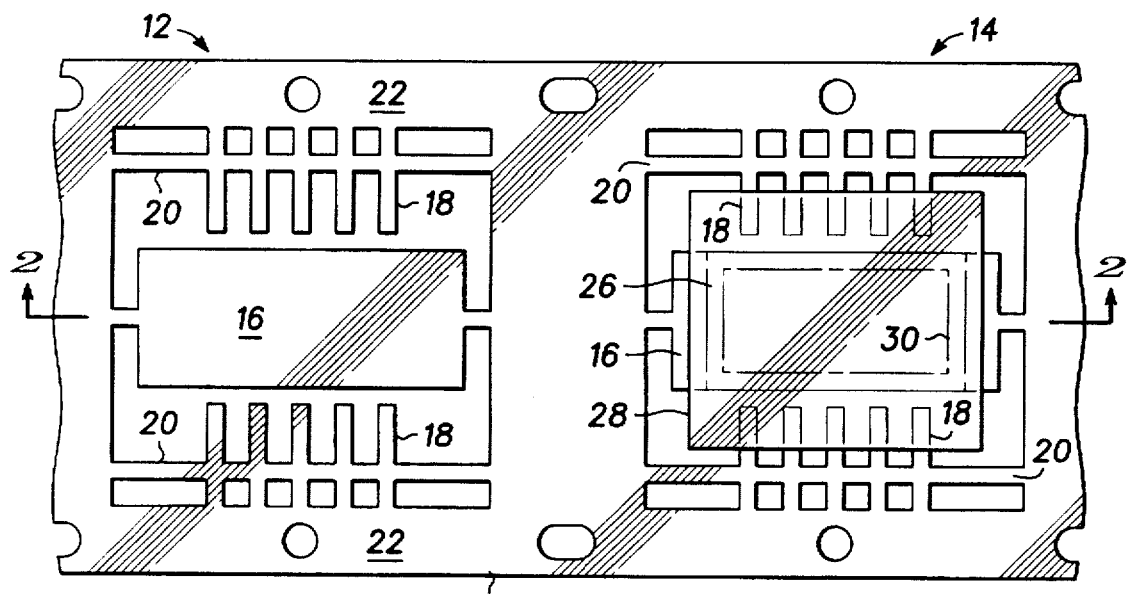
FIG. 1 is a plan view.
Figure 2:
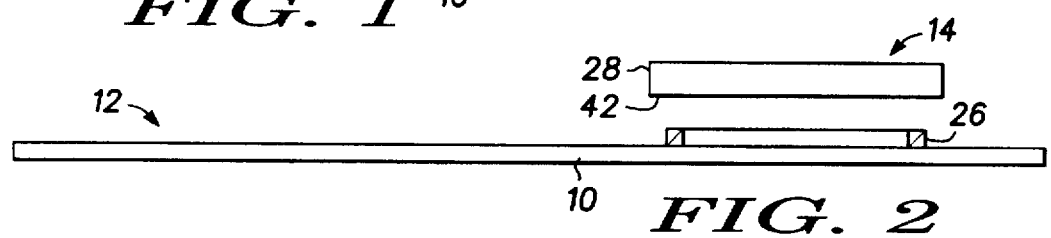
FIG. 2 is a cross-sectional view at the location indicated in FIG. 1, of a lead frame suitable for use with SAW die for encapsulation, showing different stages of manufacture, according to the present invention.

FIG. 1 shows a simplified plan view, and FIG. 2 shows a simplified cross-sectional view, illustrating the structure and manufacture of a plastic encapsulated SAW device according to the present invention, at different stages of manufacture. Lead frame 10, typically of metal such as Kovar$^{tm}$, or copper, or a plated metal combination, comprises die flag 16 on which a SAW device is to be mounted, fingers 18 intended to connect to the various electrical leads on the SAW device, dam bars 20 for mold sealing and supporting side rails 22. Portion 12 of lead frame 10 of FIG. 1 illustrates the state of the lead frame at the beginning of the manufacturing process. Portion 14 of lead frame 10 of FIG. 1 shows a section substantially identical to that depicted in portion 12 but with the addition of annular sealing ring 26 on die flag 16 and with the location of SAW die 28 indicated in position above annular sealing ring 26. In FIG. 1, SAW die 28 is shown as being transparent and its surface details omitted so that its position relative to the underlying portions of lead frame 10 and sealing ring 26 can be seen. Annular sealing ring 26 has inside perimeter 30 which, as is explained in connection with FIG. 6 infra, is larger than and lies outside active region 52 of active surface 42 of SAW device 28.

Figure 3:
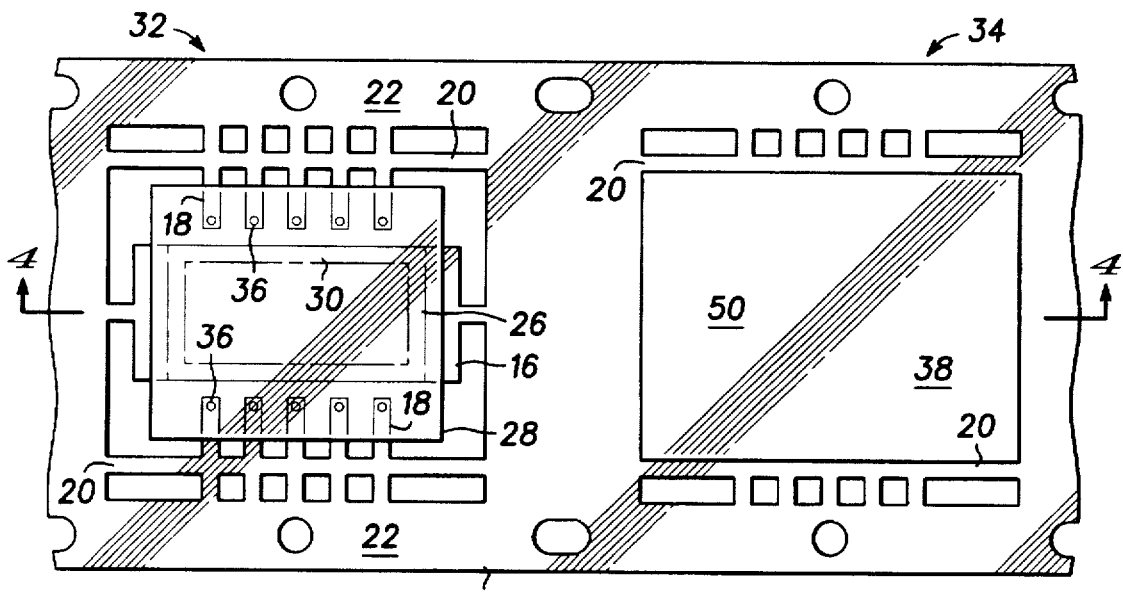
FIGS. 3 and 4 are analogous to FIGS. 1 and 2, respectively, but at later stages in the manufacturing process.
Figure 4:
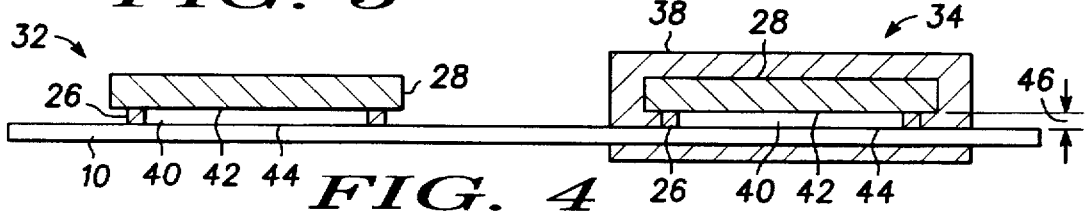

Referring now to FIGS. 3–4, portion 32 of lead frame 10 illustrates the situation when SAW die 28 has been sealed via annular sealing ring 26 to die flag 16 and contacts 36 on SAW die 28 make electrical connection with die flag fingers 18. In FIG. 3 as in FIG. 1, SAW die 28 is shown as being transparent and its surface details omitted so that the underlying arrangement of lead frame 10 and the connection of fingers 18 and contacts 36, and of sealing ring 26, can be easily seen.

Portion 34 of lead frame 10 in FIGS. 3–4 illustrates the situation after molding of plastic encapsulation 38 around SAW die 28 and lead frame die flag 16 and the internal ends of contact fingers 18. Since die 28 is sealed to lead frame 10 by annular sealing ring 26 prior to molding of plastic encapsulation 38 around the die, there exists void 40 (see FIG. 4) between active surface 42 of die 28 and upper surface 44 of lead frame 10. Void 40 has thickness 46.

Figure 5:
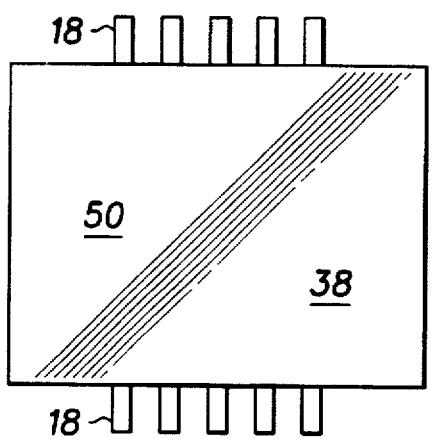
FIG. 5 shows a simplified plan view of an encapsulated device according to the present invention.

FIG. 5 shows a plan view of encapsulated SAW device 50 with contact leads 18 protruding from the sides thereof after dam bars 20 and rails 22 of lead frame 10 (FIGS. 1–4) have been sheared away in a conventional manner. SAW die 28 is entirely surrounded by plastic molding compound 38, in the preferred configuration, but this is not essential. The bottom (inactive) surface of die 28 can be exposed if desired.

Figure 6:
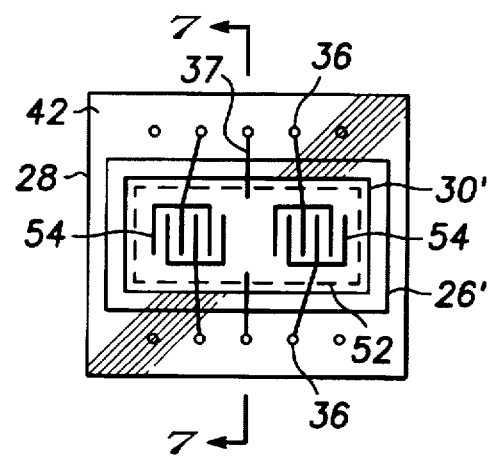
FIG. 6 shows a plan view of the active surface of a SAW die prior to encapsulation, according to the present invention.
Figure 7:
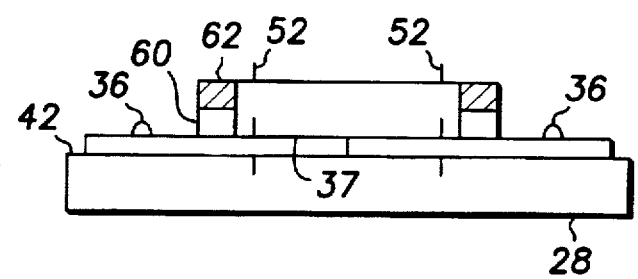
FIG. 7 is a simplified partial cross-sectional and cutaway view of the SAW die of FIG. 6 at the location indicated in FIG. 6.

FIG. 6 is a plan view of active surface 42 of SAW die 28. However, not all of surface 42 is active in terms of the propagation of acoustic waves. Generally the propagation of acoustic waves occurs within a central region 52 of surface 42 as illustrated by the dashed outline in FIGS. 6–7. Within region 52 lie electrode structures 54 which are coupled by thin plated or evaporated or sputtered metal leads 37 to external contacts 36. The details of electrodes 54 within active region 52 of SAW die 28 are beyond the scope of the present invention and those shown in connection with FIGS. 6–7 are intended to be merely representative. Persons of skill in the art will understand how to provide the appropriate electrode structures on die 28 to achieve the desired performance which they seek.

External contacts 36 of die 28 are coupled to lead frame fingers 18 during the process in which die 28 is sealed to annular sealing ring 26 at the location 26' illustrated in FIG. 6. It will be noted in connection with FIG. 6, that the electrical leads extending between electrodes 54 and contacts 36 run underneath the region wherein annular sealing ring 26, 26' contacts surface 42. In the preferred embodiment, the material of sealing ring 26 is a dielectric, as for example a thermoplastic material or thermosetting material or catalyzed material or glass which is an electrical insulator. Examples of suitable material are epoxies, silicones, low temperature glasses and other types of insulators which are heat softenable. It is desirable that these materials have low outgassing rates and glass transition or softening temperatures above the injection or cure temperatures of encapsulant 38.

In connection with the foregoing description of FIGS. 1–4, the process of manufacture and structure of device 50 is illustrated for the case wherein annular sealing ring 26 is located on lead frame 10. However, those of skill in the art will understand based on the description herein, that annular sealing ring 26 can equally well be located on die 28 as shown, for example, by annular ring 26' in FIG. 6. Alternatively, sealing material can be applied both on lead frame 10 and on die 28 so that the seal is effectuated between the material of two mating annular coated regions 26, 26'. Any of these methods are satisfactory. The material of sealing rings 26, 26' can also be a heat softenable glass material, as for example, any of the well known metal and dielectric sealing glasses used in connection with encapsulation of semiconductor and other electronic devices.

It is also possible to use the above described structure and method in connection with metal solder sealing materials. However, since sealing ring 26, 26' passes across leads 37 running from contacts 36 to electrode structures 54, an insulating layer must be provided over leads 37 to prevent an annular solder region having the shape of regions 26, 26' from shorting leads 37 together.

FIG. 7 is a cross-sectional and partial cutaway view of SAW device 28 at the location shown in FIG. 6 illustrating a composite structure for sealing ring 26, 26'. Annular dielectric ring 60 is located between leads 37 and annular electrically conductive (e.g., metal) solder sealing ring 62 which attaches to die flag 16. Ring 60 is readily formed using conventional wafer processing techniques, before separation of the SAW devices into individual die. Suitable materials for ring 60 are quartz, glass, and plastic resin, as for example polyimide.

The use of metal solders for ring 62 is particularly advantageous, because they can be melted in vacuum and have, in general, much lower outgassing rates than are encountered with typical organic sealing materials. Further, the thickness of material required to effect a seal is generally substantially less, thereby minimizing the height of the gap above surface 42 of die 28. The use of metal solder for ring 62 to seal die 28 to die flag 16 is further advantageous since very low leak rates can be achieved with metal solders. Accordingly, void 40 (and analogous voids 74, 82) above active device region 52 can be made at least as hermetic as using conventional solder seal or welded metal packages.

Also illustrated in FIG. 7 are contacts 36 in the form of solder bumps or other types of conductive joining materials (e.g., conductive epoxy or glass) which provide continuity from electrical leads 37 to fingers 18 of lead frame 10.

In a preferred embodiment, the distance 46 (see FIG. 4) separating surface 42 and surface 44 can be controlled by including within annular sealing material 26, glass microspheres of a predetermined diameter. In this way, as the plastic or low temperature glass material of ring 26 melts or softens, die 28 collapses toward surface 44 until it is resting upon the microspheres contained within the sealing material of ring 26. Such microspheres can be obtained with diameters of a few microns, more or less, and are supplied by a number of manufacturers well known in the art.

Figure 8:
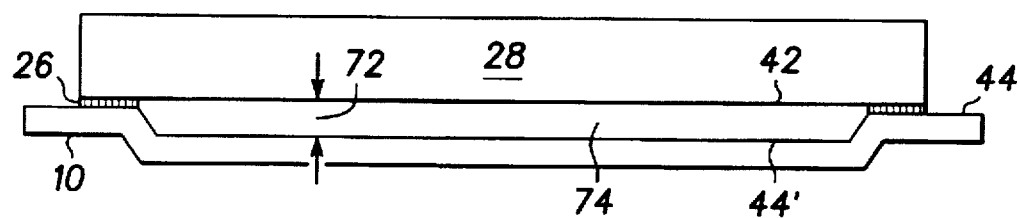
FIG. 8 shows a cross-sectional view analogous to the left-hand portion of FIG. 4, somewhat enlarged, according to a further embodiment of the present invention.
Figure 9:
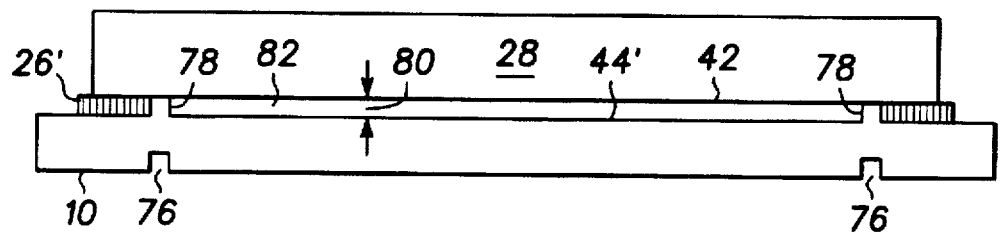
FIG. 9 shows a cross-sectional view analogous to that in FIG. 8 but according to a still further embodiment of the present invention.

FIGS. 8–9 are cross-sectional views analogous to portion 32 of FIG. 4 showing alternative embodiments of the present invention. In the embodiment shown in FIG. 8, lead frame 10 has downward coined region 70 wherein upper surface 44' of lead frame 10 in coined region 70 has been depressed by approximately distance 72 below upper surface 44. Die 28 is sealed by means of annular ring 26 to upper surface 44 of lead frame 10 over cavity 74 created by coined region 70. In this manner, a gap of height 72 is provided between surface 44' of lead frame 10 and active surface 42 in region 52 of SAW die 28. An advantage of this approach is that separation 72 between surfaces 42, 44' is determined, except for the sealing material, by the amount of coining of lead frame 10. This allows for the use of a the minimum amount of sealing material for ring 26 since it is not required to space die 28 from the die flag 16.

FIG. 9 is a view analogous to that in FIG. 8 showing a still further embodiment of the present invention, in which lead frame 10 has an annular ridge coined in an upward direction at location 76 to create annular ridge 78 so that when surface 42 of die 28 is in contact with annular ridge 78 distance 80 is predetermined. In the preferred embodiment, sealing material 26, 26' is located outside the perimeter of ridge 78 so that it is prevented by ridge 78 from squeezing into cavity 82 between surface 42 of die 28 and surface 44' of lead frame 10.

It is desirable that height 46, 72, 80 be as small as possible but not zero, so as to minimize the void above die surface 42, especially in region 52. In this way, even if the void is not completely sealed against all external vapors, the amount of any entering vapor which might then condense on surface 42 in active region 52 is correspondingly very small. If height 46, 72, 80 is of the order of a few microns or less, then, only under the most unusual circumstances would more than a few monolayers condense onto surface 42. Thus, even in the absence of total hermeticity, there is under most circumstances, little adverse influence on the electroacoustic properties of the die. The tendency of materials such as moisture vapor to condense can be inhibited by pre-treating the surface with a water repellent (hydrophobic) layer.

Having thus described the invention, those of skill in the art will understand that many modifications can be made to the above described process, structure and materials without departing from the spirit of the present invention and it is intended to include such variations in the claims that follow.

I claim:

1. A plastic encapsulated surface acoustic wave (SAW) device, comprising:

a surface acoustic wave (SAW) die having a broad face containing an active region having an outer perimeter;

a die flag having a surface in juxtaposition to and facing toward said broad face, wherein a central portion of said die flag has been coined to provide a relief space between said surface of said die flag and said broad face of said SAW die;

an annular sealing ring joining said broad face and said surface of said die flag and leaving a void disposed over said active region, wherein said annular sealing ring has an inner perimeter larger than said outer perimeter of said active region;

a plastic encapsulant around said SAW die and said die flag outside said void; and external electrical contacts protruding from said SAW device and coupled to corresponding contacts on said broad face of said SAW die.

2. A device as claimed in claim 1, wherein there is provided an annular ridge protruding above said die flag and facing toward said broad face of said SAW die such that an inner perimeter of said annular ridge lies outside said outer perimeter of said active region.

3. A device as claimed in claim 2, wherein said annular sealing ring lies outside an exterior perimeter of said annular ridge.

4. A device as claimed in claim 1, where there is further provided on said broad face of said SAW die, an annular dielectric region insulating electric leads extending from contact regions near a periphery of said SAW die to within said active region, said annular dielectric region insulating said electric leads from an overlying annular electrically conductive solder region.

5. A surface acoustic wave (SAW) device, comprising:

a surface acoustic wave (SAW) die having a broad face containing an active region having an outer perimeter and electrical contacts lying outside said active region;

a die mounting region having a surface in juxtaposition to and facing toward said broad face, wherein a central portion of said die mounting region has been coined to provide a relief space between said surface of said die mounting region and said broad face of said SAW die;

an annular sealing ring comprising a heat softenable sealing material, said annular sealing ring joining together said broad face and said surface of said die mounting region leaving a void therebetween over said active region, wherein said annular sealing ring has an inner perimeter larger than said outer perimeter of said active region; and external electrical leads coupled to electrical contacts on said broad face of said SAW die by a heat softenable conductor, wherein said heat softenable sealing material and said heat softenable conductor are softened substantially simultaneously to join, respectively, said SAW die to said die mounting region and said electrical contacts to said external electrical leads.

6. A SAW device manufactured by a method comprising steps of:

providing a surface acoustic wave (SAW) die having a broad face containing an active region having an outer perimeter and having electrical contacts lying outside said outer perimeter of said active region;

providing a lead frame having a die flag and multiple electrode fingers extending toward said die flag, said die flag having a surface in juxtaposition to and facing toward said broad face, wherein a central portion of said die flag has been coined to provide a relief space between said surface of said die flag and said broad face of said SAW die;

providing an annular sealing ring on either or both of said die flag and said broad face, wherein said annular sealing ring has an inner perimeter larger than said outer perimeter of said active region;

positioning said SAW die in juxtaposition to said lead frame so that said die flag faces said active region and said multiple electrode fingers face said electrical contacts; and heating said SAW die and lead frame to, substantially simultaneously, (i) electrically connect said electrical contacts to said multiple electrode fingers, and (ii) join said broad face and said die flag by said annular sealing ring, leaving a void above said active region.

\* \* \* \* \*